United States Patent

Han et al.

[11] Patent Number: 5,995,156
[45] Date of Patent: Nov. 30, 1999

[54] PHASE LOCKED LOOP FOR MPEG SYSTEM

[75] Inventors: Young Tae Han; Soon Hong Kwon; Dong Ho Lee; Sung Ho Cho, all of Taejeon, Rep. of Korea

[73] Assignee: Korea Telecommunication Authority, Seoul, Rep. of Korea

[21] Appl. No.: 08/695,294

[22] Filed: Aug. 9, 1996

[30] Foreign Application Priority Data

Aug. 9, 1995 [KR] Rep. of Korea ...................... 95-24567

[51] Int. Cl.$^6$ .............................. H04N 5/04; H03L 7/00
[52] U.S. Cl. ...................... 348/500; 348/516; 348/521; 348/536; 331/1 R; 455/180.3
[58] Field of Search .................................. 375/327, 294, 375/354, 376; 348/505, 516, 524, 500, 521, 536, 735; 331/1 R, 41, 88, 177, 20, 21, 145, 149, 153, 172; 327/147, 151, 156, 160; 370/509; 395/200.78, 551, 558; 329/325, 360; 332/127, 155, 159; 455/180.3; 713/400

[56] References Cited

U.S. PATENT DOCUMENTS

| | | | |
|---|---|---|---|
| 4,305,045 | 12/1981 | Metz et al. | 331/1 A |
| 4,972,442 | 11/1990 | Steierman | 375/357 |
| 5,008,749 | 4/1991 | Ruckert | 348/495 |
| 5,467,342 | 11/1995 | Logston et al. | 370/253 |
| 5,473,385 | 12/1995 | Leske | 348/845.3 |
| 5,528,183 | 6/1996 | Maturi et al. | 327/151 |
| 5,588,025 | 12/1996 | Strolle et al. | 375/316 |
| 5,768,326 | 6/1998 | Koshiro et al. | 375/376 |

*Primary Examiner*—John A. Follansbee
*Attorney, Agent, or Firm*—Merchant & Gould P.C.

[57] ABSTRACT

A phase locked loop for synchronizing decoding clocks with encoding clocks in a Moving Picture Experts Group (MPEG) system. The phase-locked loop circuit includes a voltage controlled oscillator for converting a decoding clock into an encoding clock, a register unit for storing multiplexing program clock reference signals, each input with a desired number of bits, a counter being initialized by a first program clock reference signal output from the register unit, thereby generating a local program clock reference signal, and a phase error control unit for combinationally operating the program clock reference signal stored in the register unit and the local program clock reference signal, thereby generating a phase error signal for controlling the voltage controlled oscillator.

1 Claim, 2 Drawing Sheets

PHASE LOCKED LOOP FOR MPEG SYSTEM

BACKGROUND OF THE INVENTION

1. Field of the Invention

The present invention relates to a phase locked loop (PLL), and more particularly to a phase locked loop for synchronizing decoding clocks with encoding clocks in a Moving Picture Experts Group (MPEG) system.

2. Description of the Prior Art

System coding in MPEG systems is carried out using transport streams or program streams. Transport streams are applied to an environment involving errors whereas program streams are applied to an environment relatively free of errors. In the case of the present invention, transport streams are used.

Programs with one or more independent time bases are coupled to a string of bits which is called "a transport stream". In this case, packetized elementary streams (PES's) each consisting of a string of elementary bits form programs sharing the same time base, respectively. Such transport stream packets have a length of 188 bytes and are variable in bit rate. The bit rate of transport stream packets is determined by the position and value of the field of a program clock reference (PCR). The synchronization among multiple elementary bit strings is enabled by the PCR.

SUMMARY OF THE INVENTION

An object of the invention is to provide a PLL capable of synchronizing decoding clocks with encoding clocks in an MPEG system, thereby involving no phase error.

In accordance with the present invention, this object is accomplished through a phase-locked loop circuit for an MPEG system comprising: a voltage controlled oscillator for converting a decoding clock into an encoding clock; a register unit for storing multiplexing program clock reference signals, each input with a desired number of bits; a counter being initialized by a first program clock reference signal output from the register unit, thereby generating a local program clock reference signal; and a phase error control unit for combinationally operating the program clock reference signal stored in the register unit and the local program clock reference signal, thereby generating a phase error signal for controlling the voltage controlled oscillator.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

Figure 1:
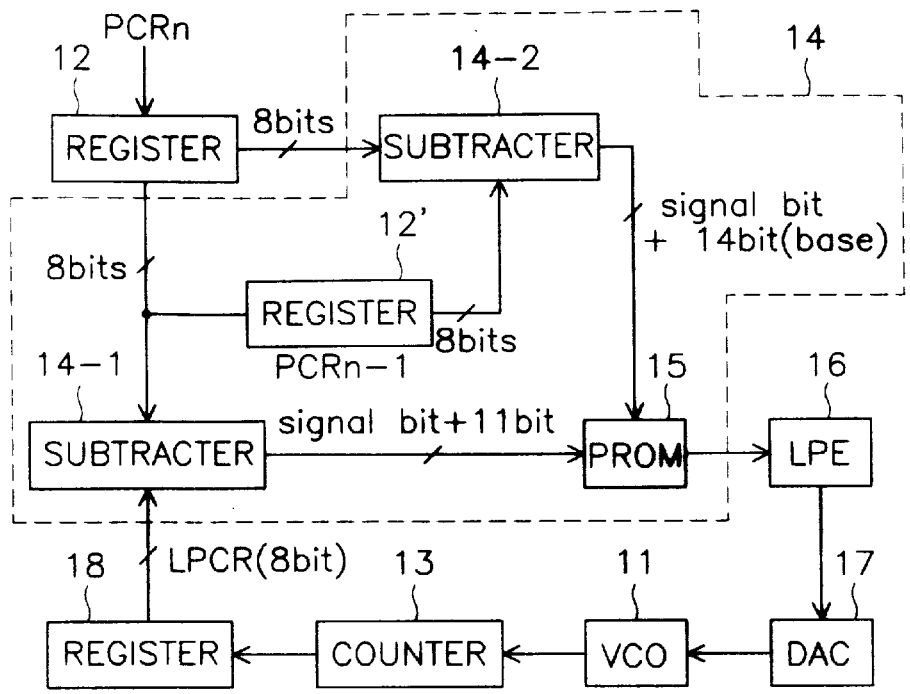
FIG. 1 is a block diagram of a PLL according to an embodiment of the present invention.

FIG. 1 illustrates a PLL according to an embodiment of the present invention.

As shown in FIG. 1, the PLL includes a voltage controlled oscillator (VCO) 11 for converting a decoding clock into an encoding clock, and register units 12 and 12' respectively for storing multiplexing PCR signals, each input with a desired number of bits. The PLL also includes a counter 13 adapted to be initialized by a first PCR signal output from the register unit, thereby generating a local program clock reference (LPCR) signal, and subtracters 14 each adapted to combinationally operate the PCR signal stored in the register unit 12 and the LPCR signal, thereby generating a signal for controlling the VCO 11.

The operation of the PLL according to the present invention will now be described in detail.

Figure 2:
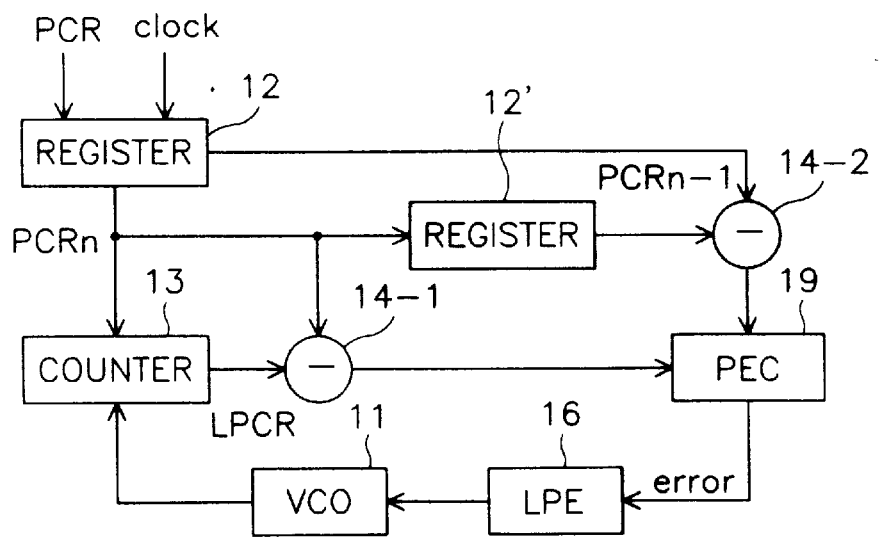
FIG. 2 is a block diagram illustrating a configuration realizing a phase locking according to the present invention.

FIG. 2 is a block diagram illustrating a configuration realizing a phase lock according to the present invention.

A 42-bit PCR consists of a 33-bit PCR base field and a 9-bit PCR expansion field. The PCR base field uses a frequency obtained by dividing a system clock frequency by 300 whereas the PCR expansion field uses the system clock frequency. Since the system clock frequency of MPEG is 27 MHz, the PCR base field has a clock frequency of 90 MHz, and the PCR expansion field has a clock frequency of 27 MHz. The PCR expansion field has a value ranging from 0 to 299. When the value of the PCR expansion field becomes 300, all bits of the PCR expansion field are reset to zero. At this time, the 1st bit of the PCR base field is incremented by 1.

A 42-bit PCR signal input at the PLL is first stored in one of the register units 12 and 12', namely, the first register unit. The first register unit 12 then generates an output signal PCRn. The output signal PCRn of the register unit 12 initializes the 42-bit counter 13 in its initial state. The output signal PCRn of the register unit 12 is also stored in the second register unit 12' which, in turn, generates an output signal PCRn-1. The counter 13 executes the same operation in accordance with the standard of a system to which the PLL is applied. When the next PCR signal is input at the PLL, the first register unit 12 generates an output PCRn again in response to the next PCR signal. Simultaneously, the counter 13 generates a LPCR signal. A phase error generated in this case can be calculated as follows.

When it is assumed that the time interval between PCRn and PCRn-1 is T, $$T=(PCRn-PCRn\text{-}1)/(27\times10^6).$$

When it is assumed that the phase difference generated at every time interval between PCRn and PCRn-1 is P, $$P=(LPCR-PCRn)/T=(LPCR-PCRn)\times27\times10^6/(PCRn-PCRn\text{-}1).$$

On the other hand, an error used to control the VCO 11 is a normalizing pulse position modulation (PPM) phase error. When it is assumed that the PPM phase error is E, $$E=(LPCR-PCRn)\times10^6/(PCRn-PCRn\text{-}1).$$

In other words, the PPM phase error is obtained by subtracting PCRn from LPCR, dividing the resultant value by a value obtained after subtracting PCRn-1 from PCRn, and multiplying the resultant value by $10^6$. Such an error signal is forced to pass a low-pass filter (LPF) 16 so that its correctable frequency range can be fixed. The output from the LPF 16 is sent to the VCO 11 to control the VCO 11. As the VCO 11 is controlled, the counting frequency of the counter 13 is modified.

As shown in FIG. 2, all signals PCRn, LPCR and PCRn-1 generated in the PLL consist of 42 bits. For this reason, the PLL requires a very complex computation system for executing 42-bit computations. The complexity in computation can be reduced when the computation for 42 bits is executed by dividing each 42-bit signal into 8-bit portions and executing those 8-bit portions respectively at 6 clocks, instead of executing the 42-bit signal at once.

Where this computation is used, it is possible to realize the 42-bit subtraction using a 8-bit subtractor.

The phase error control unit of FIG. 2 serves as the subtractor 14. In subtraction operations for "PCRn−PCRn-1" and "LPCR−PCRn", each 9-bit expansion field can have a digit ranging from 0 to 299. Where the 33-bit base field borrows a digit from the 9-bit expansion field, the borrow digit is 512 in the case of a typical binary subtraction. In the above-mentioned system, however, the borrow digit should be 300. For this reason, a required accurate subtraction result can not be obtained by only using a binary subtraction. In this regard, the subtractor 14 is adapted to solve this problem.

It is assumed that there are two 42-bit digits (A and B). In both of the digits, the 9-bit expansion fields have a digit ranging from 0 to 299, which is as similar to the system standard. In this case, the binary subtraction for "A−B" includes four methods as follows:

First: A. Base (41:9)≧B. Base (41:9), A. Expansion (8:0)≧B. Expansion (8:0);
Second: A. Base (41:9)<B. Base (41:9), A. Expansion (8:0)<B. Expansion (8:0);
Third: A. Base (41:9)≧B. Base (41:9), A. Expansion (8:0)<B. Expansion (8:0); and
Fourth: A. Base (41:9)<B. Base (41:9), A. Expansion (8:0)≧B. Expansion (8:0),
where, "A. Base (41:9)" means values of bits ranging from the 41st bit of the digit A to the 9th bit.

The first and second subtraction methods are executed in the same manner as the binary subtraction. That is, these methods have the same result as the binary subtraction. The third method obtains the same result as that obtained by subtracting 212 from the result of the binary subtraction. On the other hand, the fourth method obtains the same result as that obtained by adding 212 to the result of the binary subtraction. The results of these methods are shown in the following table 1.

TABLE 1

| | Subtraction Condition in System of FIG. 2 | | |
|---|---|---|---|
| | Condition 1 | Condition 2 | Subtraction Result (41 − 0) |
| A(41:0) − B(41:0) | A(41:9) ≧ B(41:9) | A(8:0) ≧ B(8:0) | A − B |
| | A(41:9) ≧ B(41:9) | A(8:0) ≧ B(8:0) | A − B − 212 |
| | A(41:9) < B(41:9) | A(8:0) ≧ B(8:0) | A − B + 212 |
| | A(41:9) < B(41:9) | A(8:0) ≧ B(8:0) | A − B |

Now, let's drive the denominator of the above-mentioned phase error equation using the above subtraction system.

In accordance with the standard of the MPEG-2 system, the interval between transmitted PCR's should not exceed 0.1 second. In the worst case, the value of the denominator "PCRn−PCRn-1" is always equal to or less than "27×10$^6$". In this case, the value of the denominator, namely, the difference between PCRn and PCRn-1 consists of 42 bits including a base field of 9000 and an expansion field of 0. Since the expansion field of the difference between PCRn and PCRn-1 should always be less than 300, its influence on the result of the computation is minor. In this regard, the expansion field is neglectible.

Accordingly, although 14 bits from the 33-bit base field of the subtraction resulting from "PCRn−PCRn-1" are taken along with signal bits, there is no significant effect on the result.

Figure 3:
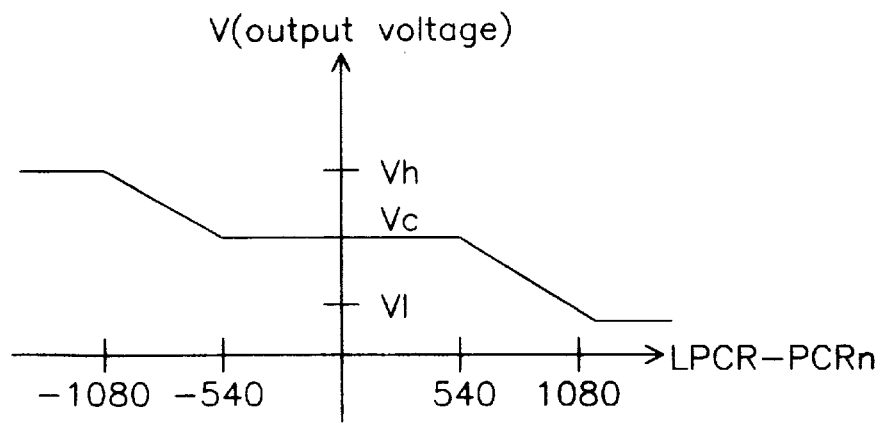
FIG. 3 is a graph depicting the data transmission characteristic of a low-pass filter shown in FIG. 2.

The calculation of the range of "LPCR−PCRn", which is the numerator of the phase error equation, depends on the correctable phase error PPM range of the VCO 11. If the correctable phase error PPM is ±200 PPM, the numerator of the phase error equation is on the order of ±540 PPM when the denominator has a maximum value, as shown in FIG. 3. If it is assumed that the allowable phase shift range is ±540 PPM as proposed by the MPEG system, required bits from the 42-bit subtraction result of "LPCR−PCRn" are 11 bits including 9 bits of the expansion field and 2 least-significant bits of the base field, along with signal bits. In this case, the capacity of a required programmable read only memory (PROM) is 32 Mega words because the input has 25 bits in total. The PROM is denoted by the reference numeral 15 in FIG. 1.

Figure 4:
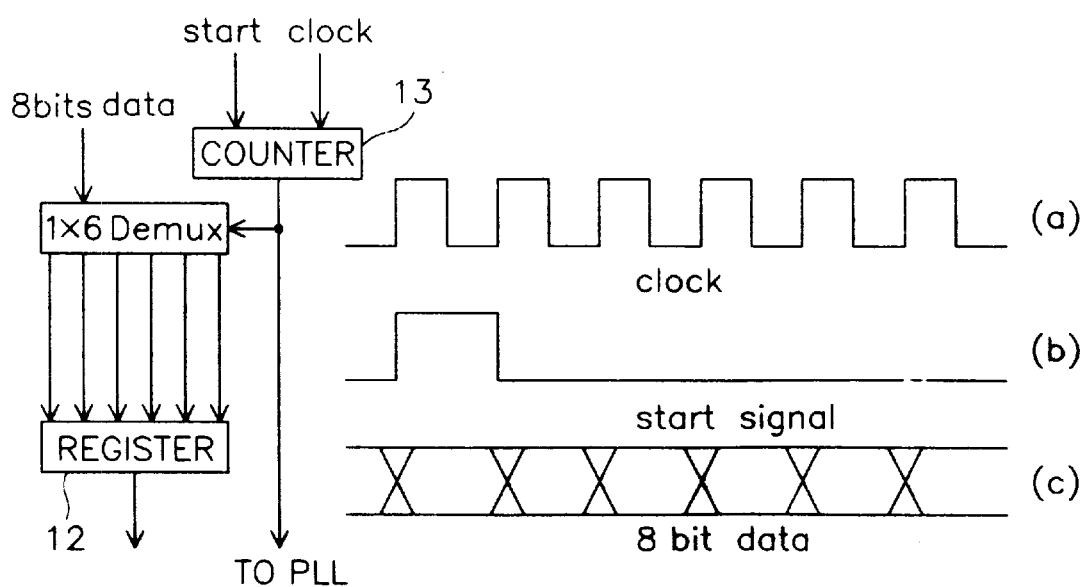
FIG. 4 is a view illustrating the operation of the PLL shown in FIG. 2.

In the operation of the PLL carried out in the above-mentioned manner, it is very important to recognize the inputting of a PCR and to store an accurate value of the PCR in the PCRn register 12. To this end, the counter 13 of the present invention serves as a means for indicating the inputting of a PCR. In other words, the counter 13 is reset to "0" when a start signal is generated. This start signal has an activating clock edge at the moment the most significant bit of a PCR begins to be input (FIG. 4). The counter 13 increments its counted value by one for every clock. That is, the start signal is detected to operate the counter for every clock. Transmission of data is carried out in sync with the activating clock edge and the counted value of the counter. The operation of the subtractor 14 also operates in sync with the activating clock edge and the counted value of the counter. In FIG. 1, the reference numeral 17 denotes a digital/analog convert (DAC).

As is apparent from the above description, the PLL of the present invention operates for a plurality of clocks of a system clock frequency, instead of a single clock. Accordingly, it is possible to realize a 42-bit bus and subtractor using a reduced number of bits. It is also possible to efficiently execute subtraction operations for "LPCR−PCRn" and "PCRn−PCRn-1" in a manner similar to that in the MPEG system. Also, multiplication computations for deriving a phase error can be achieved through a PROM without using multipliers. Accordingly, it is possible to reduce the complexity of the system.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A phase-locked loop circuit for MPEG system comprising:

a voltage controlled oscillator for converting a decoding clock into an encoding clock;

a first register unit for storing multiplexing program clock reference signals (PCRs) each input with a desired number of bits;

a counter being initialized by a first program clock reference signal (PCR) output from the register unit, thereby generating a local program clock reference signal (LPCR);

a second register unit for storing local program clock reference signals (LPCRs) generated from the counter;

a phase error control unit for combinationally operating the program clock reference signal (PCR) stored in the register unit and the local program clock reference signal (LPCR), thereby generating a phase error signal for controlling the voltage controlled oscillator, wherein the phase error control unit comprises a subtractor, further comprising, a programmable read only memory connected to an output of the phase error control unit, thereby storing the phase error signal from the phase error control unit therein, a programmable read only memory, wherein the phase error signal in the phase error control unit is obtained by the following equation:

$$E=(LPCR-PCRn)\times 10^6/(PCRn-PCRn\text{-}1);$$

E: Phase Error;
LPCR: Local Program Clock Reference Signal;
PCRn: Current Program Clock Reference Signal;
PCRn-1 Previous Program Clock Reference Signal;
and a low-pass filter for fixing the frequency range of the phase error signal stored in the programmable read only memory to a correctable range; and when the first and second the subtractors execute a subtraction for two-42 bit digits (A and B), it obtains the following result:

if $A(41:9) \geq B(41:9)$ and $A(8:0)\ B(8:0), A-B$;

if $A(41:9) \geq B(41:9)$ and $A(8:0)\ B(8:0), A-B-212$;

if $A(41:9) < B(41:9)$ and $A(8:0)\ B(8:0), A-B+212$; and if $A(41:9) < B(41:9)$ and $A(8:0)\ B(8:0), A-B$, where, "A(41:9)" and "B(41:9)" represent 33-bit base fields of the 42-bit digits A and B, respectively, and "A(8:0)" and "B(8:0)" represent 9-bit expansion fields of the 42-bit digits A and B, respectively.

* * * * *